United States Patent
Hui et al.

(10) Patent No.: US 6,187,653 B1
(45) Date of Patent: Feb. 13, 2001

(54) METHOD FOR ATTRACTIVE BONDING OF TWO CRYSTALLINE SUBSTRATES

(75) Inventors: Sanghee Park Hui, New Providence; Barry Franklin Levine, Livingston; Christopher James Pinzone, Basking Ridge; Gordon Albert Thomas, Princeton, all of NJ (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/465,884

(22) Filed: Dec. 17, 1999

(51) Int. Cl.[7] .................. H01L 21/30; H01L 21/46; H01L 21/44; H01L 21/48
(52) U.S. Cl. ................. 438/455; 438/107; 438/938
(58) Field of Search .................. 438/455, 456, 438/457, 458, 459, 107, 118, 119, 938; 451/41

(56) References Cited

U.S. PATENT DOCUMENTS

| | | | |
|---|---|---|---|
| 4,063,349 | * 12/1977 | Passler et al. | ............ 29/627 |
| 4,846,931 | 7/1989 | Gmitter et al. . | |
| 4,883,561 | 11/1989 | Gmitter et al. . | |
| 5,207,864 | 5/1993 | Bhat et al. . | |
| 5,230,184 | * 7/1993 | Bukhman | ............ 51/283 |
| 5,344,517 | 9/1994 | Houlding . | |
| 5,407,856 | 4/1995 | Quenzer et al. . | |
| 5,496,433 | * 3/1996 | Miyashita et al. | ............ 156/358 |
| 5,840,616 | 11/1998 | Sakaguchi et al. . | |
| 6,107,123 | * 8/2000 | Distefano et al. | ............ 438/125 |
| 6,113,466 | * 9/2000 | Lin | ............ 451/41 |

* cited by examiner

Primary Examiner—John F. Niebling
Assistant Examiner—Viktor Simkovic
(74) Attorney, Agent, or Firm—Mathews, Collins, Shepherd & Gould P.A.

(57) ABSTRACT

A process for device fabrication is disclosed in which two substrates having different crystal lattices are bound together. In the process the substrate surfaces are placed in physical contact with each other. A flexible membrane is placed in physical contact with a surface of one of the substrates. Pneumatic force is applied to the flexible membrane. The duration of the contact and the pressure of the contact are selected to facilitate a bond between the two substrate surfaces that results from attractive Van der Waals' forces between the two surfaces. The bulk of one of the substrates is then typically removed. Thereafter, the bonded surfaces are heated to a high temperature to effect a permanent bond.

8 Claims, 1 Drawing Sheet

METHOD FOR ATTRACTIVE BONDING OF TWO CRYSTALLINE SUBSTRATES

BACKGROUND OF THE INVENTION

1. Technical Field

The present invention is directed to processes for fabricating devices, such as photodetector devices, in which two crystalline substrates with different crystal lattices are bound together.

2. Description of the Related Art

Processes for fabricating certain semiconductor devices require that two wafers, each having a crystal lattice that is different from the other, be bound together. For example crystalline III–V substrates (e.g. substrates of Indium Phosphide (InP) and Indium Gallium Arsenide (InGaAs)) substrates are bound to crystalline silicon substrates to fabricate photodetectors. Such devices are described in Hawkins, A., et al., "Silicon heterointerface photodetector," *Appl. Phys. Lett.*, Vol. 68:26, pp. 3692–3694 (1996) (hereinafter Hawkins et al.). As used herein, III–V substrates are semiconductor compounds in which one of the elements is from column III of the Mendeleef Periodic Table and one of the elements is from column V of that Table.

Hawkins et al. describe a process for fabricating avalanche photodetector devices in which a silicon wafer is fused directly to an InGaAs surface of an indium phosphide (InP) substrate. In the Hawkins et al. process, an InGaAs surface is epitaxially grown on the InP substrate. The bonding surface of the silicon wafer is an epitaxial silicon layer grown on an n+ substrate with a shallow p-type implant at the surface. After bonding, the InP substrate is subsequently removed leaving only the InGaAs layer and the other thin device layers bound to the silicon substrate. The bonding is performed by pressing the surfaces of the two substrates together for 20 minutes at 650° C. in an $H_2$ atmosphere.

U.S. Pat. No. 5,207,864 describes low temperature fusion of dissimilar semiconductors. In the case in which both wafers are compound semiconductors, the wafers are lightly pressed together and left at a temperature at which one of the compositions can atomically rearrange at the interface. In the case in which one of the wafers is silicon, the wafers are pushed together in a strong acid. The wafers are adhered together with Van der Waals forces. Thereafter, they are pressed together and anealed at a temperature at which the non-silicon composition can atomically rearrange.

The quality of the semiconductor devices depends on, among other things, the quality of the silicon-InGaAs interface. Accordingly, a process for forming a high quality interface between the two different surfaces is desired.

SUMMARY OF THE INVENTION

The present invention is a process for bonding together two substrates (typically semiconductor wafers) each substrate having a crystal lattice structure that is different from the other. The invention is further directed to a process for device fabrication in which a first is substrate with a first crystal lattice structure is bound to a second substrate with a second crystal lattice structure. In the context of the present invention, a difference in lattice constant that is greater than about 0.1 percent qualifies as a different crystal lattice.

In the process of the present invention, a first substrate is placed in physical contact with a second substrate. A flexible membrane is placed in physical contact with the contacted first substrate and second substrate. Pneumatic force is applied to the flexible membrane for a sufficient time in order for an attractive force to develop between the two substrates. This attractive force, referred to herein as Van der Waals force, develops sufficiently when the substrates are held together for about five to about thirty minutes.

Subsequent conventional processing steps can be used to form a desired device from the attractively bonded substrates. For example, after the two substrates are Van der Waals' bonded together, a portion of one of the substrates is typically removed prior to device fabrication. For example, in the context of the photodetector devices previously described, it is desired to bond a silicon substrate to a III–V device layers such as InGaAs device layers formed on a III–V semiconductor substrate (e.g. an InP substrate). The bulk of either the first substrate or the second substrate is etched away after the substrates are Van der Waals bound together. Only one or more discrete, thin layers formed on the removed substrate remain bound to the other substrate. In order to ensure that the desired device layer(s) remain, an etch stop layer is formed on the III–V substrate. After the bulk of one substrate is removed leaving only the layer(s) formed thereon bound to the other substrate, the structure is heated to a temperature sufficient to induce a covalent bond between the device layer(s) and the other substrate.

DETAILED DESCRIPTION

As previously described, the invention is directed to a process for bonding two crystal substrates, each having a crystal lattice constant different from the other, together. One problem associated with bonding two such substrates together are the strains introduced into the substrates in the regions adjacent to the bond that arise from the lattice mismatch between the two substrates. These strains create interface states, defects, and traps. The presence of these interface states, defects, and traps adversely affects device performance.

Figure 1:
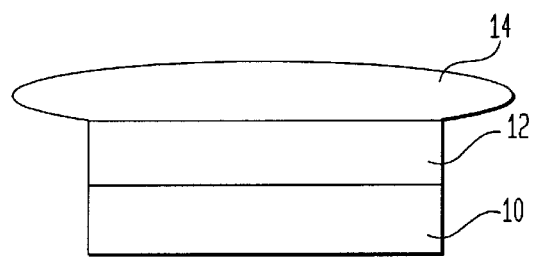
FIG. 1 is a schematic side view showing body of a first substrate to a second substrate.

In the present invention, a first substrate having a first crystal lattice is bound to a second substrate having a second crystal lattice utilizing Van der Waals' force to hold the bonding surfaces together. First substrate 10 contacts second substrate 12, as shown in FIG. 1. Flexible membrane 14 is placed over the contacted substrates. A suitable flexible membrane 14 is formed of latex, natural rubber, styrene butadiene rubber (SBR) or other thermoplastic materials which are known in the art. Flexible membrane 14 is selected to have a size larger than the size of first substrate 10 and second substrate 12. Pneumatic pressure is applied to flexible membrane 14 to press second substrate 12 against first substrate 12 in order to effect the desired Van der Waals bonding. For example, pneumatic pressure can be applied with nitrogen gas. Pressures in the range of about 2 to about 200 lbs/square inch are suitable. The substrates are held together for some time, typically about 5 to about 30 minutes, in order for Van der Waals bonding to occur. The present process is advantageous because the flexible membrane allows a substantial surface area of the substrates to be pressed together in order to effect the desired Van der Waals bonding.

For example, first substrate 10 is a silicon substrate and second substrate 12 is a crystalline III–V substrate such as Indium Phosphide (InP) or Indium Gallium Arsenide (InGaAs) or a III–V device layer(s) formed on a sacrificial III–V bulk substrate. Second substrate 12 is a crystalline silicon substrate. However, since the invention is directed to bonding two surfaces with different crystal lattices, the invention is not limited to these specific materials.

First substrate 10 and second substrate 12 that are to be bound together can be first cleaned to remove contamination and oxides from their surfaces. The cleaning conditions for the surface of the device layer(s) are selected so that the cleaned device layer(s) surface is substantially free of contamination, substantially smooth, and has a stoichiometry that is substantially identical to the non-surface portion of the device layer. This means that the surface of the device layer(s) is relatively free of impurity (e.g. oxides). This also means that the relative amounts of the Group III and Group V elements in the surface is similar to the relative amounts of those elements in the nonsurface portion of the device layer. Various combinations of conventional cleaning expedients are contemplated as suitable for achieving these objectives.

After the substrates are cleaned, they are placed in a chamber that isolates the substrates from the ambient atmosphere and yet allows the substrates to be moved within the chamber. A conventional glove box is suitable for this purpose. After the substrates are placed in the chamber, the chamber is evacuated and an inert atmosphere is introduced. An inert atmosphere is an atmosphere that does not contain constituent gases that react with the substrate materials. A nitrogen atmosphere is suitable for this purpose. The surfaces of the substrates are then cleaned again. Conventional cleaning expedients are contemplated as suitable.

Subsequent processing steps can be performed after Van der Waals bonding of first substrate 10 to second substrate 12 to form a desired device. For example, the bulk of a III–V substrate can be removed by etching. Either dry etching or wet etching expedients are contemplated as suitable. One example of a suitable wet etch expedient is a spray of aqueous hydrochloric acid (HCl). In order to stop the etch before the device layer(s) are removed, the III–V substrate has an etch stop layer formed thereon (e.g. InGaAs) which prevents the etch from progressing to the device layer(s). The structure is then heated to effect a covalent bond between the III–V surface and the surface of the silicon substrate. Conditions suitable for effecting a covalent bond (i.e. temperature and duration) are well known to one skilled in the art. Exemplary conditions are a temperature in the range of about 630° C. to about 650° C. for about 15 to about 30 minutes.

Crystal substrates with different crystal lattices are bound together to form a variety of devices, one example of which is an avalanche photodetector device. In the avalanche photodetector device, there is a III–V substrate for the absorption of light and the generation of carriers. The carriers are multiplied in the silicon substrate, which results in the amplification of the electrical signal generated by the device.

Figure 2:
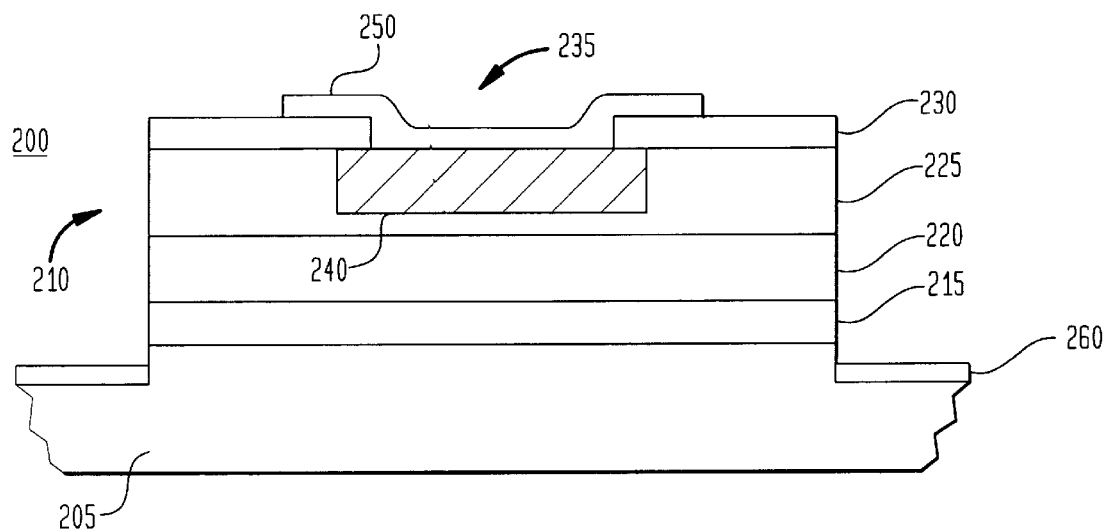
FIG. 2 is a schematic side view of a device formed by the present invention.

One example of an avalanche detector is illustrated in FIG. 2. The device 200 illustrated in FIG. 2 is formed on an n+ silicon substrate 205. A patterned stack of materials 210 forms the device 200. The patterned stack is layer of n–silicon 215 on which is formed a layer of n–InGaAs 220, a layer of InP 225, a layer of silicon dioxide ($SiO_2$) 230, and a layer of p-type metal 250 (e.g. gold-beryllium alloy). A window 235 was formed in the $SiO_2$ layer 230 in stack 210 and zinc was diffused therein to form the p-n junction 240.

The n-contact 260 is aluminum. Other structures for avalanche detectors are well known to one skilled in the art.

The above-described device is prepared by forming one or more InGaAs and InP layers on an InP substrate. The one or more InGaAs and InP (or other suitable III–V materials) layers are referred to as device layers. Before the InGaAs device layers are formed on the InP substrate an etch stop layer is formed thereon to isolate and protect the device layers from the etchant used to remove the bulk of the InP substrate during subsequent processing. Suitable materials for such an etch stop are well known to one skilled in the art. Examples of suitable etch stop materials include InGaAs.

The InGaAs or InP layers are grown on the InP substrate using conventional CVD techniques. Typically the InGaAs or InP layers have a thickness of about 0.05 $\mu$m to about 5 $\mu$m. After the InGaAs layers are formed on the substrate, the substrate is maintained at a temperature below 500° C. to avoid depleting arsenic from the InGaAs.

As previously noted, the surfaces of the substrates are cleaned prior to being placed in contact with each other. Although conventional cleaning expedients are contemplated as suitable, the following cleaning sequence was found to adequately clean substrate surfaces for subsequent Van der Waals bonding. The following example is provided to illustrate the present invention.

EXAMPLE

Before placing the surface of a silicon substrate in contact with the above-described InP substrate with a layer of InGaAs formed thereon, the surfaces of both substrates were cleaned, as described in a previous patent. The silicon surface was cleaned using the following sequence:

1. swabbing the silicon substrate with cotton soaked with isopropyl alcohol to remove dust;

2. boiling the silicon substrate in acetone for five minutes;

3. rinsing the silicon surface in deionized water;

4. repeating steps 2 and 3;

5. boiling the silicon substrate in isopropyl alcohol for five minutes; and 6. rinsing the silicon surface in deionized water.

The silicon substrate was then immersed in a 1:1 solution of $H_2SO_4:H_2O_2$ to remove particles from the surface. The surface was then subsequently rinsed with deionized water for ten minutes.

The silicon substrate was then cleaned using a standard wafer cleaning process known as RCA1. This process removes resist and particles from the surface of the silicon substrate. The substrate was boiled (80° C.) in the RCA1 solution (100 ml deionized water; 25 ml $NH_4OH$; 25 ml $H_2O_2$ in which the $H_2O_2$ was added after the deionized water and the $NH_4OH$ boiled). The substrate was then rinsed in deionized water for 10 minutes.

The substrate was then placed in an aqueous solution of hydrofluoric acid (1 part by volume of 50% HF and 10 parts by volume water) and then rinsed in deionized water for ten minutes. The RCA1-rinse cycle was then repeated, and the silicon substrate was blown dry.

The InGaAs surface of the InP substrate was also cleaned using the following procedure. First the InGaAs surface was swabbed with cotton soaked with isopropyl alcohol to remove dust. The substrate was then boiled in acetone for five minutes. The substrate was then boiled is in a new acetone solution for another five minutes. The substrate was then boiled in isopropyl alcohol for five minutes. The InGaAs surface was then subjected to UV ozone cleaning for 10 minutes after which the substrate was placed in an aqueous solution of hydrofluoric acid (1 part $H_2O$ to 4 parts HF (10%)). The InGaAs surface was then rinsed in DI water for 30 seconds and subsequently blow-dried. The InGaAs surface was then exposed to UV ozone cleaning for another 10 minutes.

Both of the cleaned substrates were then placed in a "glove box" (i.e. a container in which the contents inside are capable of being manually manipulated using gloves mounted on the side thereof). The atmosphere inside glove box was evacuated and replaced with nitrogen gas. The InGaAs substrate was then placed in an aqueous solution of hydrofluoric acid for 30 seconds to remove any oxides that had formed on the surface. The InGaAs substrate was then subsequently rinsed in deionized water and blow-dried (using nitrogen gas). The silicon substrate was placed in the aqueous solution of HF for 30 seconds, after which the substrate was blow-dried (using nitrogen gas).

The two cleaned wafer surfaces were then placed in physical contact with each other. A flexible membrane was placed over the contacted wafers. Pneumatic pressure of about 2–200 lbs per square inch was applied to the flexible membrane to ensure good physical contact.

After about 5 to about 30 minutes, the two wafers were removed from the glove box and placed in an HCl etcher to removed the bulk InP portion of the InGaAs substrate. The resulting structure was then heated in a flowing hydrogen atmosphere to a temperature of about 630° C. to about 650° C. for about 15 to 30 minutes.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

What is claimed:

1. A process for fabricating a device comprising the steps of:

selecting a first single crystal substrate having a first crystal lattice and a second single crystal substrate having a second crystal lattice different from the first crystal lattice;

placing a surface of the first single crystal substrate in physical contact with a surface of the second single crystal substrate;

placing a flexible membrane in physical contact with the contacted first single crystal substrate and second single crystal substrate; and applying pneumatic pressure to the flexible membrane for a duration sufficient to obtain a bond between the surface of the first single crystal substrate and the second single crystal substrate.

2. The process of claim 1 wherein the flexible membrane is formed of latex, natural rubber or styrene butadiene rubber.

3. The process of claim 1 wherein the step of applying pneumatic pressure is performed at a pressure of about 2 lbs. per square inch to about 200 lbs. per square inch for a duration of about 5 minutes to about 30 minutes.

4. The process of claim 1 wherein the first single crystal substrate is a silicon substrate and the second single crystal substrate is a III–V single crystal substrate with at least one III–V device layer formed thereon.

5. The process of claim 4 wherein the III–V single crystal substrate is an indium phosphide substrate and the at least one III–V device layer is selected from the group consisting of indium gallium arsenide and indium phosphide.

6. The process of claim 5 further comprising the steps of:

removing the second substrate, leaving the single crystal device layer bonded to the first single crystal substrate; and heating at a high temperature the first single crystal substrate to increase the strength of the bond between the first single crystal substrate and the single crystal device layer bonded thereto.

7. The process of claim 6 wherein the high temperature heating is performed at a temperature of about 630° C. to about 650° C. for a duration of about 15 minutes to about 30 minutes.

8. The process of claim 1 further comprising the step of:

cleaning the first surface of the first single crystal substrate and the single crystal device layer before the step of placing the first single crystal substrate in physical contact with the second single crystal substrate.

* * * * *